US011693798B2

(12) United States Patent
Lee et al.

(10) Patent No.: US 11,693,798 B2
(45) Date of Patent: Jul. 4, 2023

(54) LAYERED READY STATUS REPORTING STRUCTURE

(71) Applicant: SAMSUNG ELECTRONICS CO., LTD., Suwon-si (KR)

(72) Inventors: Pyeongwoo Lee, Sunnyvale, CA (US); Young deok Kim, San Jose, CA (US)

(73) Assignee: Samsung Electronics Co., Ltd., Yongin-si (KR)

(*) Notice: Subject to any disclaimer, the term of this patent is extended or adjusted under 35 U.S.C. 154(b) by 0 days.

(21) Appl. No.: 17/111,188

(22) Filed: Dec. 3, 2020

(65) Prior Publication Data

US 2022/0012196 A1  Jan. 13, 2022

Related U.S. Application Data

(60) Provisional application No. 63/050,665, filed on Jul. 10, 2020.

(51) Int. Cl.
*G06F 13/20* (2006.01)
*G06F 13/40* (2006.01)
(Continued)

(52) U.S. Cl.
CPC ............ *G06F 13/20* (2013.01); *G06F 3/0655* (2013.01); *G06F 3/0683* (2013.01);
(Continued)

(58) Field of Classification Search
CPC .... G06F 13/1684; G06F 13/20; G06F 13/385; G06F 13/4004; G06F 13/4009;
(Continued)

(56) References Cited

U.S. PATENT DOCUMENTS 10,534,561 B1* 1/2020 Yuan ..................... G06F 3/0658
2002/0108076 A1* 8/2002 Barenys ................ G06F 11/221
714/E11.161

(Continued)

OTHER PUBLICATIONS

"The I2C-Bus Specification". Version 2.0. Dec. 1998. Philips Semiconductors. (Year: 1998).*

(Continued)

*Primary Examiner* — Thomas J. Cleary
(74) *Attorney, Agent, or Firm* — Lewis Roca Rothgerber Christie LLP

(57) ABSTRACT

A storage system includes a controller; a first storage device including a first ready/busy pin and a second storage device including a second ready/busy pin; a first data bus communicatively coupled between the controller, the first storage device, and the second storage device; and a first shared ready/busy signal channel communicatively coupled to the first ready/busy pin of the first storage device, the second ready/busy pin of the second storage device, and the controller according to a wire-sharing protocol, wherein the first storage device is configured to send the first device ID and status information associated with the first storage device to the controller via the first shared ready/busy signal channel and the second storage device is configured to send the second device ID and status information associated with the second storage device to the controller via the first shared ready/busy signal channel.

19 Claims, 9 Drawing Sheets

(51) Int. Cl.
  *G06F 3/06*    (2006.01)
  *G06F 13/16*   (2006.01)
  *G11C 7/10*    (2006.01)

(52) U.S. Cl.
  CPC ...... *G06F 13/1684* (2013.01); *G06F 13/4027* (2013.01); *G11C 7/1063* (2013.01); *G06F 2213/0016* (2013.01)

(58) Field of Classification Search
  CPC ............. G06F 13/4022; G06F 13/4027; G06F 13/4045; G06F 3/0683; G06F 2213/0016; G11C 7/1063; G11C 7/22
  See application file for complete search history.

(56) References Cited

U.S. PATENT DOCUMENTS

| | | |
|---|---|---|
| 2006/0149857 A1 | 7/2006 | Holman |
| 2010/0322020 A1 | 12/2010 | Kim |
| 2011/0153900 A1* | 6/2011 | Zitlaw ................ G06F 13/1689 710/313 |
| 2011/0191644 A1* | 8/2011 | Oldfield .................. H04B 1/38 714/704 |
| 2012/0198129 A1 | 8/2012 | Van Aken et al. |
| 2013/0297987 A1* | 11/2013 | Gupta ................ G06F 11/1064 714/E11.054 |
| 2014/0160857 A1 | 6/2014 | Oh et al. |
| 2014/0258604 A1 | 9/2014 | Asnaashari |
| 2015/0169243 A1* | 6/2015 | Mylly .................. G06F 3/0659 711/153 |
| 2015/0187399 A1* | 7/2015 | Tuers .................. G06F 13/1689 711/103 |
| 2017/0147453 A1* | 5/2017 | Huang ................ G06F 11/2007 |
| 2018/0098278 A1* | 4/2018 | Pelletier ............ H04W 52/0212 |
| 2018/0129601 A1 | 5/2018 | Tanaka et al. |
| 2018/0150354 A1 | 5/2018 | Lee |

OTHER PUBLICATIONS

'Integrated circuit' in "The Free On-Line Dictionary of Computing". Online Jul. 3, 1997. Retrieved from Internet Dec. 13, 2021. < https://foldoc.org/integrated+circuit>. (Year: 1997).*

* cited by examiner

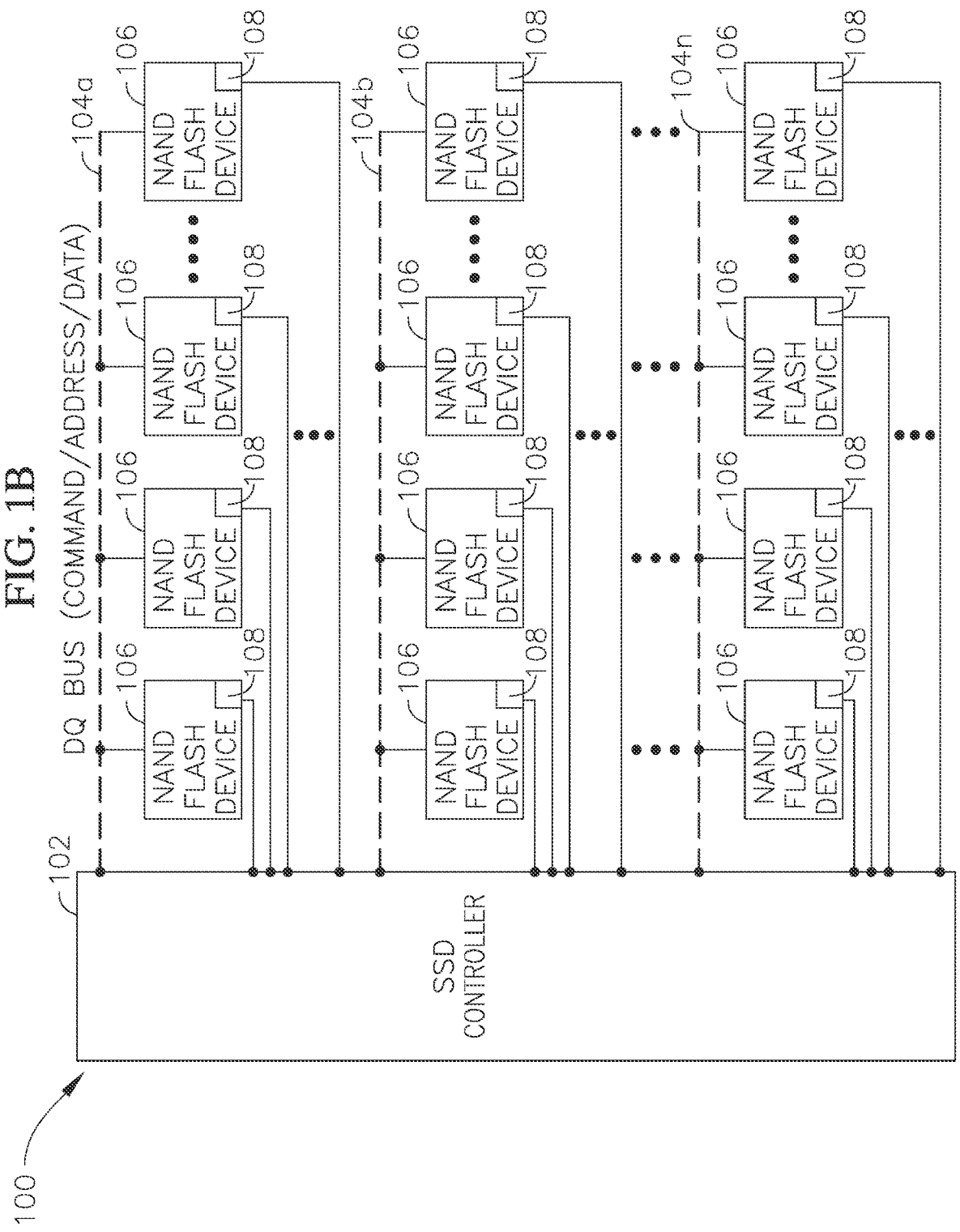

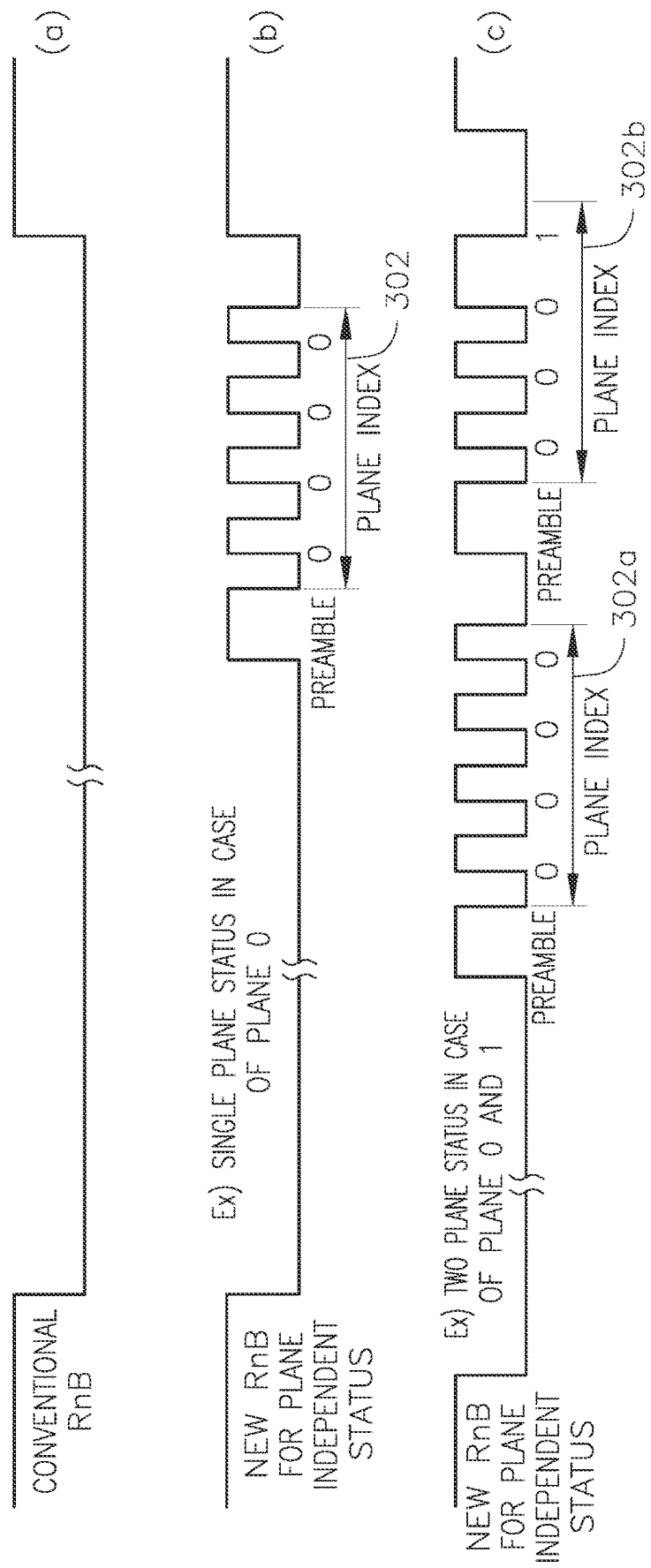

# US 11,693,798 B2

LAYERED READY STATUS REPORTING STRUCTURE

CROSS-REFERENCE TO RELATED APPLICATION(S)

The present application claims priority to and the benefit of U.S. Provisional Patent Application Ser. No. 63/050,665, filed Jul. 10, 2020 and entitled "LAYERED NAND BLOCK READY STATUS REPORTING STRUCTURE," the entire content of which is hereby expressly incorporated by reference.

FIELD

One or more aspects of the present disclosure relate to a storage device, and more particularly to a layered ready status reporting structure (e.g., a layered NOT-AND (NAND) block ready status reporting structure).

BACKGROUND

A solid state drive (SSD) is a solid-state storage device that uses integrated circuit assemblies to store data persistently using flash memory, and functions as a secondary storage in the hierarchy of computer storage. An enterprise SSD includes a plurality of flash devices (e.g., NOT-AND (NAND) logic flash devices) that share a data bus. This structure may connect a high volume of flash devices into a SSD controller that may have limited number of pad in its package.

The above information in the Background section is only for enhancement of understanding of the background of the technology and therefore it should not be construed as admission of existence or relevancy of the prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure relate to a layered ready status reporting structure.

In some embodiments, a storage system includes a controller; a first storage device including a first ready/busy pin configured to output a first ready/busy signal carrying a first device identity (ID) and status information associated with the first storage device; a second storage device including a second ready/busy pin configured to output a second ready/busy signal carrying a second device ID and status information associated with the second storage device; a first data bus communicatively coupled between the controller, the first storage device, and the second storage device; and a first shared ready/busy signal channel communicatively coupled to the first ready/busy pin of the first storage device, the second ready/busy pin of the second storage device, and the controller according to a wire-sharing protocol, wherein the first storage device is configured to send the first device ID and status information associated with the first storage device to the controller via the first shared ready/busy signal channel and the second storage device is configured to send the second device ID and status information associated with the second storage device to the controller via the first shared ready/busy signal channel.

In some embodiments, the storage system is a solid state drive (SSD), the first storage device and the second storage device are NAND flash devices, and the wire-sharing protocol is inter-integrated circuit ($I^2C$) communication protocol. In some embodiments, the first storage device is configured to send the first device ID and status information to the controller via the first shared ready/busy signal channel in response to the first storage device being updated internally, or in response to a command received from the controller.

In some embodiments, the storage system further includes a third storage device including a third ready/busy pin configured to output a third ready/busy signal carrying a third device ID and status information associated with the third storage device; a fourth storage device including a fourth ready/busy pin configured to output a fourth ready/busy signal carrying a fourth device ID and status information associated with the fourth storage device; a second data bus communicatively coupled between the controller, the third storage device, and the fourth storage device; and a second shared ready/busy signal channel communicatively coupled to the third ready/busy pin of the third storage device, the fourth ready/busy pin of the fourth storage device, and the controller according to the wire-sharing protocol, wherein the third storage device is configured to send the third device ID and status information associated with the third storage device to the controller via the second shared ready/busy signal channel and the fourth storage device is configured to send the fourth device ID and status information associated with the fourth storage device to the controller via the second shared ready/busy signal channel.

In some embodiments, the third storage device is configured to send the third device ID and status information to the controller via the second shared ready/busy signal channel in response to the third storage device being updated internally, or in response to a command received from the controller. In some embodiments, the first storage device and the second storage device are configured to act as controlling devices, and the controller is configured to act as a controlled device that receives device IDs and status information of the controlling devices.

In some embodiments, the controller is configured to act as a controlling device and the first storage device and the second storage device are configured to act as controlled devices. In some embodiments, the first storage device is configured to, in response to receiving a command comprising the first device ID of the first storage device from the controller, perform a read operation or a write operation using the first data bus in communication with the controller.

In some embodiments, a storage system includes a controller; a first storage device including a first ready/busy pin configured to output a first ready/busy signal carrying a first device identity (ID) and status information associated with the first storage device; a second storage device including a second ready/busy pin configured to output a second ready/busy signal carrying a second device ID and status information associated with the second storage device; a first data bus communicatively coupled between the controller, the first storage device, and the second storage device; and a first bridge device communicatively coupled between the controller, and the first ready/busy pin of the first storage device and the second ready/busy pin of the second storage device, the first bridge device being configured to aggregate the first ready/busy signal from the first ready/busy pin of the first storage device and the second ready/busy signal from the second ready/busy pin of the second storage device to transport to the controller.

In some embodiments, the storage system is a solid state drive (SSD) and the first storage device and the second storage device are NAND flash devices. In some embodiments, the first data bus is shared among the first storage device and the second storage device using a wire sharing protocol, wherein the wire sharing protocol is inter-integrated circuit ($I^2C$) communication protocol. In some embodiments, the first ready/busy pin of the first storage device and the second ready/busy pin of the second storage device are directly connected to the first bridge device.

In some embodiments, the first bridge device is further configured to detect the first ready/busy signal of the first storage device and the second ready/busy signal of the second storage device and report to the controller to communicate the first device ID and status information of the first storage device and the second device ID and status information of the second storage device. In some embodiments, the first bridge device is communicatively coupled to the controller via a channel to communicate the first device ID and status information of the first storage device and the second device ID and status information of the second storage device aggregated at the first bridge device to the controller.

In some embodiments, the storage system further includes a third storage device including a third ready/busy pin configured to output a third ready/busy signal carrying a third device ID and status information associated with the third storage device and a fourth storage device including a fourth ready/busy pin configured to output a fourth ready/busy signal carrying a fourth device ID and status information associated with the fourth storage device; a second data bus communicatively coupled between the controller, the third storage device, and the fourth storage device; and a second bridge device communicatively coupled between the controller, and the third ready/busy pin of the third storage device and the fourth ready/busy pin of the fourth storage device, the second bridge device being configured to aggregate the third ready/busy signal from the third ready/busy pin of the third storage device and the second ready/busy signal from the second ready/busy pin of the second storage device to transport to the controller.

In some embodiments, the first bridge device and the second bridge device are connected to the controller via a shared bus using a wire sharing protocol. In some embodiments, the first bridge device is integrated into a first flash buffer interface chip and the second bridge device is integrated into a second flash buffer interface chip. In some embodiments, the first bridge device and the second bridge device are connected with each other in a daisy-chain connection, wherein the first bridge device is configured to send, the first device ID and status information of the first storage device and the second device ID and status information of the second storage device aggregated from the first ready/busy signal and the second ready/busy signal, to the second bridge device. In some embodiments, the second bridge device is configured to aggregate the first ready/busy signal and the second ready/busy signal from the first bridge device and send the first ready/busy signal, the second ready/busy signal, the third ready/busy signal, and the fourth ready/busy signal to the controller via a bus.

In some embodiments, a method of encoding one or more plane identities (IDs) of one or more planes of a storage device, the method includes determining, by the storage device, if one or more planes of the storage device is available to perform one or more operations; based on determining that the one or more planes of the storage device is available to perform the one or more operations, turning, by the storage device, a ready/busy signal output from a ready/busy pin of the storage device to a first level and inserting one or more plane index codes associated with the one or more planes of the storage device in the ready/busy signal, wherein each of the plane index code is represented in form of a pulse and each of the plane index code follow a preamble bit; receiving, by a bridge device communicatively coupled between the ready busy pin of the storage device and a controller, the ready/busy signal including the one or more plane index codes associated with the one or more planes of the storage device, from the storage device; decoding, by the bridge device, the one or more plane index codes associated with the one or more planes of the storage device; and reporting, by the bridge device, the decoded one or more plane index codes associated with the one or more planes of the storage device, to the controller.

BRIEF DESCRIPTION OF THE DRAWINGS

These and other features of some example embodiments of the present disclosure will be appreciated and understood with reference to the specification, claims, and appended drawings, wherein:

FIGS. 1A-1B illustrate a block diagram architecture of a solid state drive (SSD) storage device, according to some embodiments of the present disclosure;

FIG. 3 illustrates timing diagrams illustrating plane ID encoding on a single ready/busy signal wire, according to some embodiments of the present disclosure.

DETAILED DESCRIPTION

Figure 1A:
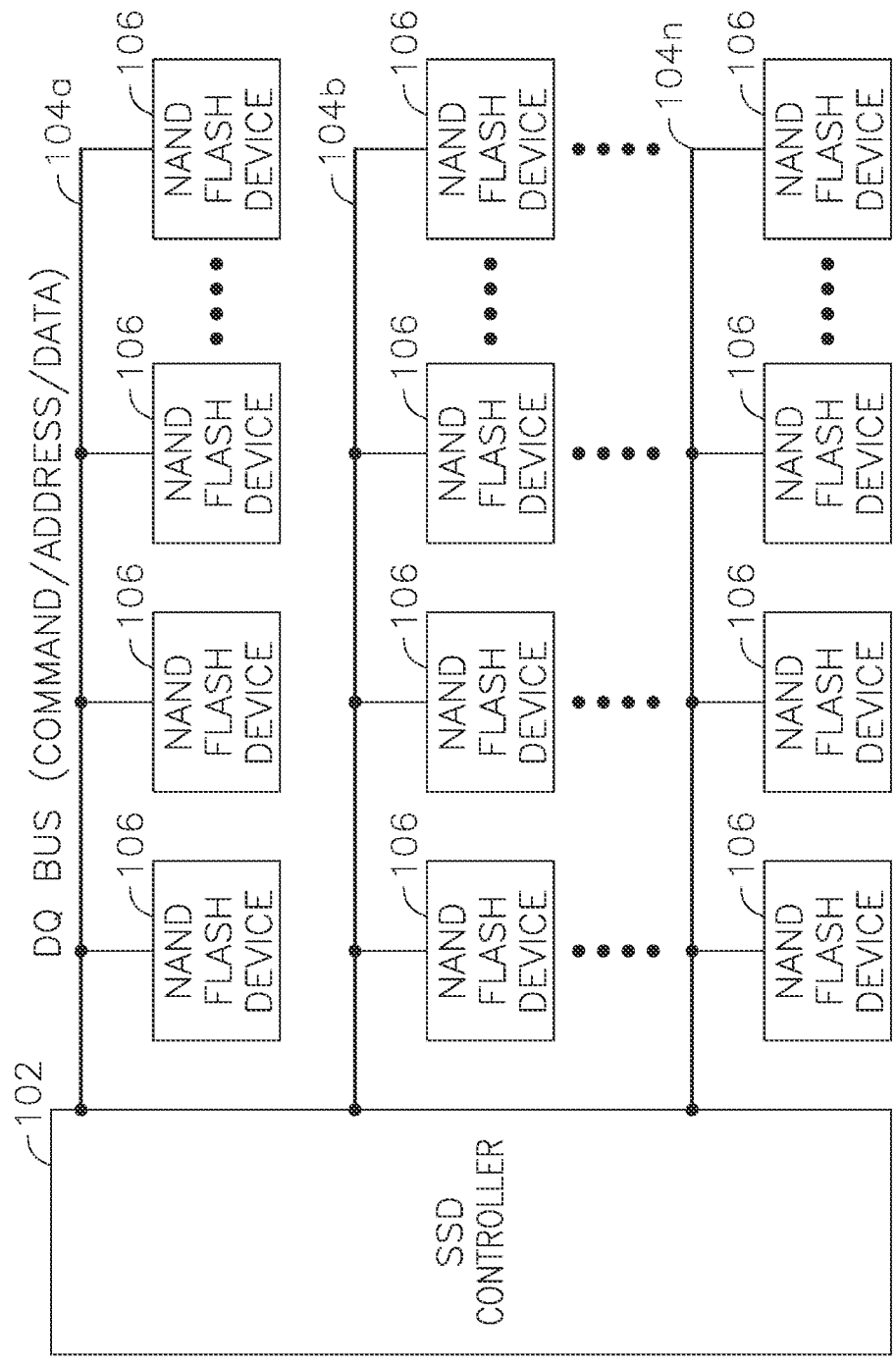

The detailed description set forth below in connection with the appended drawings is intended as a description of some example embodiments of method and apparatus for a layered ready status reporting structure provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized", respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

In some embodiments, one or more outputs of the different embodiments of the methods and systems of the present disclosure may be transmitted to an electronics device coupled to or having a display device for displaying the one or more outputs or information regarding the one or more outputs of the different embodiments of the methods and systems of the present disclosure.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

FIGS. 1A-1B illustrate a block diagram architecture of a solid state drive (SSD) storage device 100, according to some embodiments of the present disclosure. A SSD is a solid-state storage device that uses integrated circuit assemblies to store data persistently using flash memory, and functions as a secondary storage in the hierarchy of computer storage. In some embodiments, an enterprise SSD may include a plurality of NOT-AND (NAND) logic flash devices that share a data bus or a bidirectional data line (DQ) bus. This structure makes possible to connect high volume of NAND flash devices into SSD controller that has limited number of pad in its package. In some embodiments, an enterprise SSD may include other types of flash devices (e.g., NOR flash devices).

In the example shown in FIGS. 1A-1B, the SSD 100 may include a SSD controller 102 and a plurality of NAND flash devices 106 connected to the SSD controller 102 via a plurality of DQ busses 104a-104n. For example, the DQ busses 104a-104n are communicatively coupled between the plurality of NAND flash devices 106 and the SSD controller 102. For example, in some embodiments, the plurality of NAND flash devices 106 of the SSD 100 may be arranged along rows and columns. For example, each DQ bus 104a-104n of the SSD 100 may be shared among two or more NAND flash devices 106. For example, two or more NAND flash devices 106 arranged along a row may share a DQ bus from among the DQ buses 104a-104n.

However, because each of the DQ buses 104a-104n is shared among the plurality of NAND flash devices 106, the SSD controller 102 may communicate with only one NAND flash device 106 from among the plurality of NAND flash devices 106 at a time (e.g., the SSD controller 102 can actually communicate with only one NAND flash device 106 per DQ bus (e.g., DQ bus 104a-104n) at any given time). Therefore, when a specific die (e.g., a specific NAND flash device 106) occupies the DQ bus (e.g., DQ bus 104a-104n) for a certain operation, the SSD controller 102 may not send any command to the other dies (e.g., other NAND flash devices 106 connected to the same DQ bus).

In some cases, the NAND flash programming time may take between about 0.7 ms to 5 ms. To maximize die utilization, the SSD controller 102 may check the die status (e.g., status of a NAND flash device 106) by sending a die status command (e.g., by sending a die status command to a NAND flash device 106), and may also send a new next command as soon as possible. For example, the SSD controller 102 may check the status of a NAND flash device 106 by sending a die status command to the NAND flash device 106 and when the NAND flash device 106 is available, the SSD controller 102 may send a new next command to the NAND flash device 106.

For example, the NAND flash device 106 status may be inspected by reading status value through DQ bus (e.g., DQ bus 104a-104n) and only when the NAND flash device 106 is not busy, next command may be issued. However, if other die or another NAND flash device 106 is occupying the DQ bus (e.g., DQ bus 104a-104n) at that time, the SSD controller 102 may need to wait until the DQ bus (e.g., DQ bus 104a-104n) is released, or the SSD controller 102 may need to break the DQ bus traffic in certain way to issue a die status checking command. For example, late status detection of a NAND flash device 106 may happen, due to high DQ bus utilization of other NAND flash device of the plurality of NAND flash devices 106 of the SSD 100. Performance penalty due to injecting status reading among data transfers may also occur in some cases.

To minimize or reduce such an occurrence, in some cases, on a shared bus or a shared DQ bus (e.g., DQ bus 104a-104n), a ready/busy output pin 108 of the NAND flash device 106 may be used, as shown in FIG. 1B. In some embodiments, the ready/busy output pin 108 of the NAND flash device 106 may represent the status of device operation of the NAND flash device 106. In the NAND flash devices, the ready/busy signal is defined by an open NAND flash interface (ONFI) standard, where ready=1 represents that the NAND flash device is ready to receive and process a new command, and busy=0 represents that some command is in progressing in the NAND flash device. For example, when the ready/busy output pin 108 of the NAND flash device 106 is low, it indicates that a program, e.g., an erase or random read operation, is in progress in the NAND flash device 106 and upon completion of such operation, the status of the ready/busy output pin 108 returns to a high status which indicates that the NAND flash device 106 is ready to receive a new command. In some cases, however, when the ready/busy output pin 108 of the NAND flash device 106 is high, it may indicate that a program is in progress in the NAND flash device 106 and upon completion of such operation, the status of the ready/busy output pin 108 may return to a low status which may indicate that the NAND flash device 106 is ready to receive a new command.

Utilizing the ready/busy output pin 108 may be a good solution to manage DQ bus traffic.

However, because the SSD 100 includes numerous NAND flash devices 106, the SSD controller 102 may not have a dedicated pin pad for each of the plurality of NAND flash devices 106. For example, when a SSD is designed with 1024 NAND flash devices for 16 channel×64 die configuration, it requires 1024 pins (e.g., ready/busy output pins) to connect into SSD controller, which may be a very large number of pins in a SSD controller, and the large number of pins may increase the pin pad cost. For example, as shown in FIG. 1B, the ready/busy output pin 108 of each of the plurality of NAND flash devices 106 is connected to the SSD controller 102, which may be a very large number of pins for the SSD controller 102, and the large number of the ready/busy output pin 108 may increase the pin pad cost.

FIGS. 2A-2E illustrate a block diagram architecture of a SSD storage device 200, according to some embodiments of the present disclosure.

The SSD 200 may include a SSD controller 202 and a plurality of NAND flash devices 206 connected to the SSD controller 202 via a plurality of DQ busses 204a-204n. For example, the DQ busses 204a-204n are communicatively coupled between the plurality of NAND flash devices 206 and the SSD controller 202. For example, in some embodiments, the plurality of NAND flash devices 206 of the SSD 200 may be arranged along rows and columns. For example, each DQ bus 204a-204n of the SSD 200 may be shared among two or more NAND flash devices 206. For example, two or more NAND flash devices arranged along a row may share a DQ bus from among the DQ buses 204a-204n.

Figure 2A:
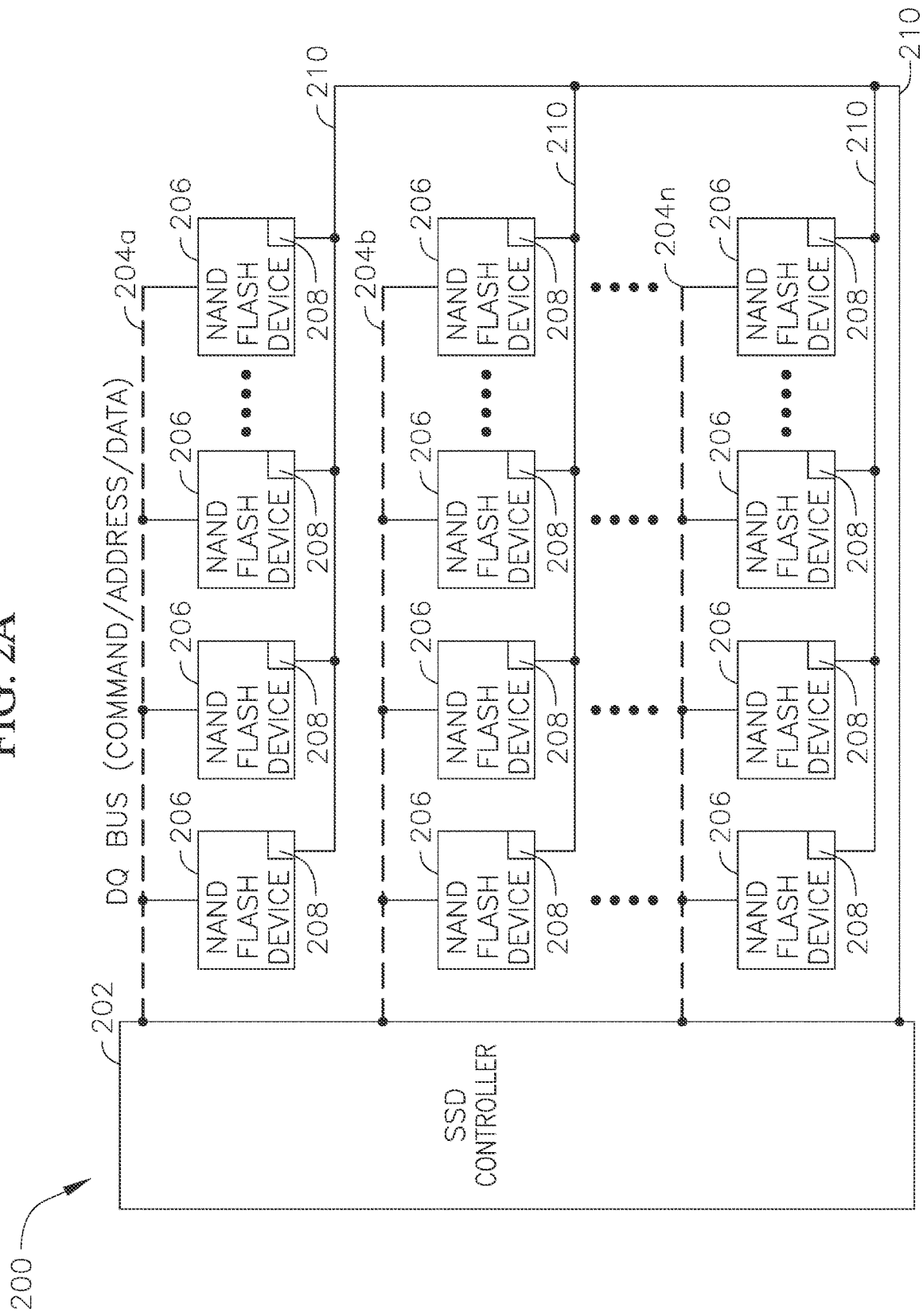
FIG. 2A illustrates a block diagram architecture of a SSD storage device with a ready/busy signal in wire-sharing protocol with single sharing bus connection, according to some embodiments of the present disclosure.

Each NAND flash device 206 from among the plurality of NAND flash devices 206 includes a ready/busy pin 208. If the ready/busy pin 208 of each of the plurality of NAND flash devices 206 is individually connected to the SSD controller 202, the large number of the ready/busy pins 208 may increase the cost to support the pin pad in the SSD controller 202. In some embodiments, as shown in FIG. 2A, to minimize or reduce the pad numbers to the SSD controller 202, the ready/busy signals output from the ready/busy pins 208 of the NAND flash devices 206 of the SSD 200 may be designed in I²C (Inter-Integrated Circuit) fashion that shares the signal wire. For example, I²C is a serial communication protocol, so data is transferred bit by bit along a single wire. I²C is synchronous, and therefore the output of bits is synchronized to the sampling of bits by a clock signal shared between a controlling device and a controlled device. The clock signal is always controlled by the controlling device. However, other types of shared links (e.g., Serial Peripheral Interface (SPI), Microwire, etc.) may be used as well in the example embodiments of FIGS. 2A-2E.

FIG. 2A illustrates a block diagram architecture of the SSD storage device 200 with a ready/busy signal in wire-sharing protocol with single sharing bus connection, according to some embodiments of the present disclosure.

In some embodiments, the NAND flash devices 206 in the SSD 200 may be connected in I²C fashion. In some embodiments, however, the NAND lash devices 206 in the SSD 200 may be connected in one or more of SPI, Microwire, etc. fashion as well.

As shown in FIG. 2A, the ready/busy pin 208 of each of the NAND flash devices 206 may share a shared ready/busy signal channel 210, which may be connected to the SSD controller 202. The ready/busy pin 208 of each of the NAND flash devices 206 may output a ready/busy signal carrying a device ID and status information associated with the corresponding NAND flash device 206. The shared ready/busy signal channel 210 is may be communicatively coupled between the plurality of NAND flash devices 206 and the SSD controller 202. Therefore, the ready/busy pin 208 of each of the plurality of NAND flash devices 206 may be connected to the SSD controller 202 via the shared ready/busy signal channel 210. In some embodiments, the shared ready/busy signal channel 210 follows I²C communication protocol to perform communication between the ready/busy pins 208 of the NAND flash devices 206 and the SSD controller 202.

Each NAND flash device 206 may have a logic that can work with shared bus like I²C, and each device (e.g., NAND flash device 206) sends its device ID and status when it is updated internally, or the SSD controller 202 can run polling to check the device status, over this shared bus (e.g., the shared ready/busy signal channel 210). For example, the SSD controller 202 may send a status read command to a corresponding NAND flash device 206. In response to receiving the status read command, the NAND flash device 206 may respond to the SSD controller 202 with its status (for example, status indicating if the NAND flash device 206 is ready to receive and process a new command from the SSD controller 202 or if the NAND flash device 206 is still processing a current command). In case the NAND flash device 206 is processing a current command, the SSD controller 202 may send (either continuously or periodically) the status read command to the NAND flash device 206 until the SSD controller 202 receives a response from the NAND flash device 206 including a "ready" status with certain time quantum, indicating that the NAND flash device 206 is ready to receive and process a new command from the SSD controller 202.

In some embodiments, all the NAND flash devices 206 may be the I²C controlling device in the multi-controlling device I²C system, and the SSD controller 202 may be the I²C controlled device that receives the NAND flash status information. When a NAND flash device 206 completes flash operation, it checks if the shared wire (e.g., the ready/busy signal channel 210) is HIGH and may attempt to pull down the wire (e.g., the ready/busy signal channel 210) for "start condition". If the NAND flash device 206 succeeds to pull down the wire (e.g., the ready/busy signal channel 210), it may transfer the NAND flash device 206 ID and status code to SSD controller 202. However, if the pulling down fails, it represents that another NAND flash device 206 is using the shared wire (e.g., the ready/busy signal channel 210). Therefore, the NAND flash device 206 may wait until the other NAND flash device 206 completes its operation, and monitors the protocol transitions (e.g., protocol transition of the ready/busy signal channel 210) to prevent potential race condition (e.g., a race to send data to the SSD controller 202) and/or data corruption.

In some embodiments, however, the SSD controller 202 may be the controlling device and the NAND flash devices 206 may be the controlled devices. When the SSD controller 202 have status reading candidate, it may send status reading to corresponding NAND flash device 206 in polling mechanism. When the SSD controller 202 sends status reading command over I²C, it specifies the flash device ID which is defined in the system, and ID-matching flash device responds on this status reading command and accordingly may perform read/write operation using the shared DQ bus 204 in communication with the SSD controller 202.

Figure 2B:
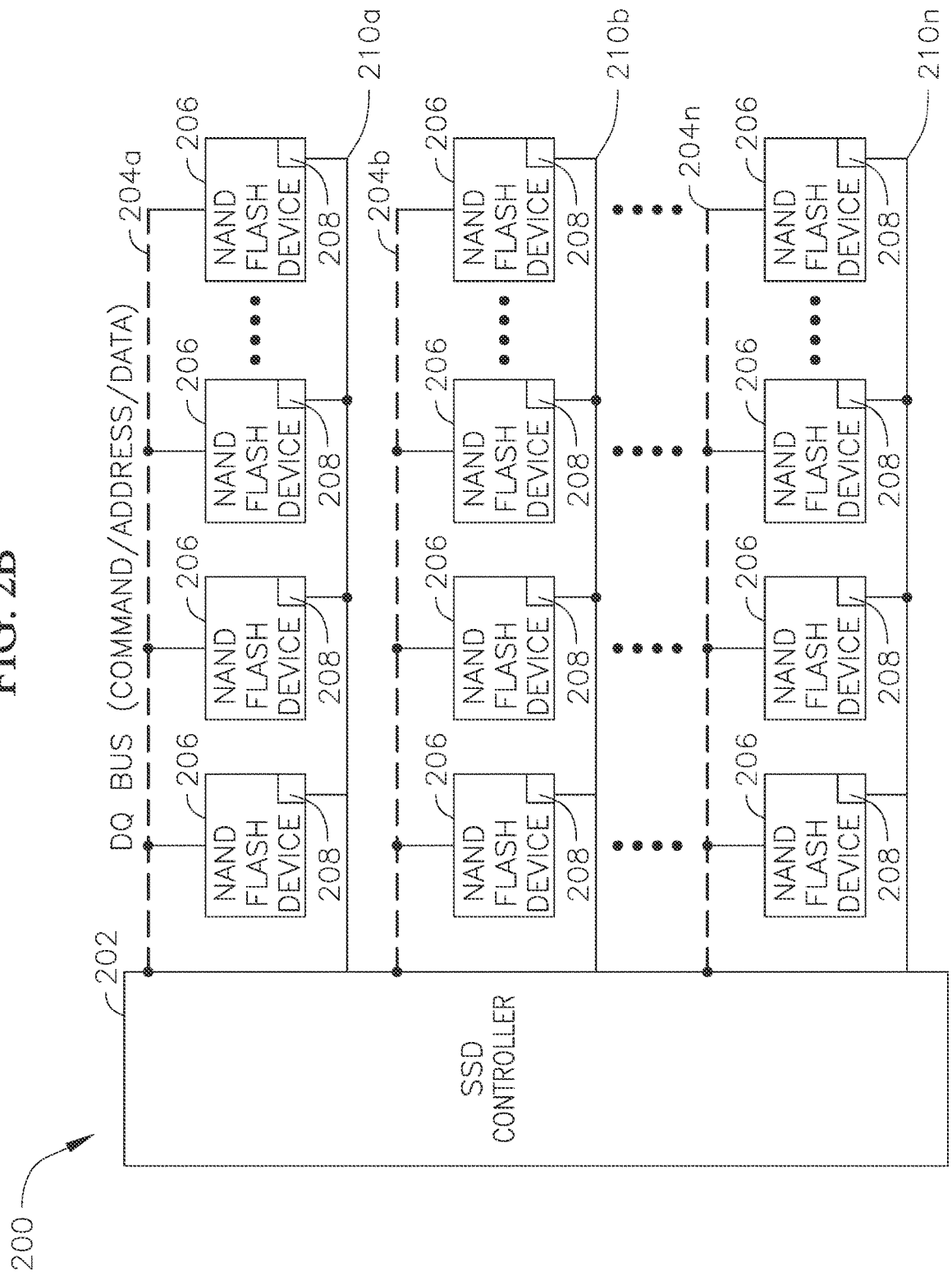
FIG. 2B illustrates a block diagram architecture of the SSD storage device of FIG. 2A with a ready/busy signal in wire-sharing protocol, with grouped sharing bus connection, according to some embodiments of the present disclosure.

FIG. 2B illustrates a block diagram architecture of the SSD storage device 200 with a ready/busy signal in wire-sharing protocol, with grouped sharing bus connection, according to some embodiments of the present disclosure.

In some embodiments, as shown in FIG. 2B, instead of single sharing bus model (as shown in FIG. 2A), the read/busy signals or the ready/busy pin 208 of each of the plurality of NAND flash devices 206 may be grouped per each channel of devices. For example, in some embodiments, as shown in FIG. 2B, the SSD 200 may include a plurality of ready/busy signal channels 210a-210n. For example, a group of two or more NAND flash devices arranged along a row of may share a ready/busy signal channel from among the plurality of ready/busy signal channels 210a-210n according to a wire sharing protocol (e.g., I²C) and each of the shared ready/busy signal channels 210a-210n may be connected to the SSD controller 202.

In some embodiments, each of the ready/busy pins 208 of the two or more NAND flash devices 206 arranged along the row is configured to carry a ready/busy signal in the wire-sharing protocol, with the ready/busy signal channel 210a-210n to connect the two or more NAND flash devices 206 to the SSD controller 202 such that the SSD controller 202 connectivity is shared among the two or more NAND flash devices 206.

In the example embodiment of FIG. 2B, the behavior of the ready/busy logic or the ready/busy pin 208 of a NAND flash device 206 is the same as in the embodiment of FIG. 2A, however, in the embodiment of FIG. 2B, the SSD controller 202 connectivity with the ready/busy channel (e.g., the ready/busy signal channels 210a-210n) is spread out over multiple point, per each channel (e.g., each of the shared ready/busy signal channels 210a-210n). Therefore, the embodiment of FIG. 2B may cover many NAND flash device connection. For example, unlike the example embodiment of FIG. 2A, where the NAND flash devices 206 are connected to the SSD controller via a single ready/busy signal channel 210, in the example embodiment of FIG. 2B, two or more NAND flash devices 206 arranged along a row share a ready/busy signal channel from among the ready/busy signal channels 210a-210n, and each of the shared ready/busy signal channels 210a-210n is connected to the SSD controller 202. Therefore, the SSD controller 202 may be connected to the ready/busy signal channels 210a-210n at multiple points.

For example, unlike the embodiment of FIG. 2A, where the ready busy pins 208 of all the NAND flash devices 206 of the SSD 200 are connected to or share a single ready/busy signal channel 210 connected to the SSD controller 202, in the example embodiment of FIG. 2B, each of the ready/busy signal channels 210a-210n are connected to or shared among two or more NAND flash devices 206 arranged in a row, and each of the ready/busy signal channels 210a-210n is further connected to the SSD controller 202. Therefore, the example embodiment of FIG. 2B may resolve pad driving issue that may happen in a single sharing bus model (as shown in FIG. 2A). However, the example embodiment of FIG. 2B may require additional pads on the SSD controller 202 to receive grouped ready/busy signal per each channel of the ready/busy signal channels 210a-210n. Further, the example embodiment of FIG. 2B may require many extra pin connections on the SSD controller 202, as much as the number of the ready/busy signal channels 210a-210n.

Figure 2C:
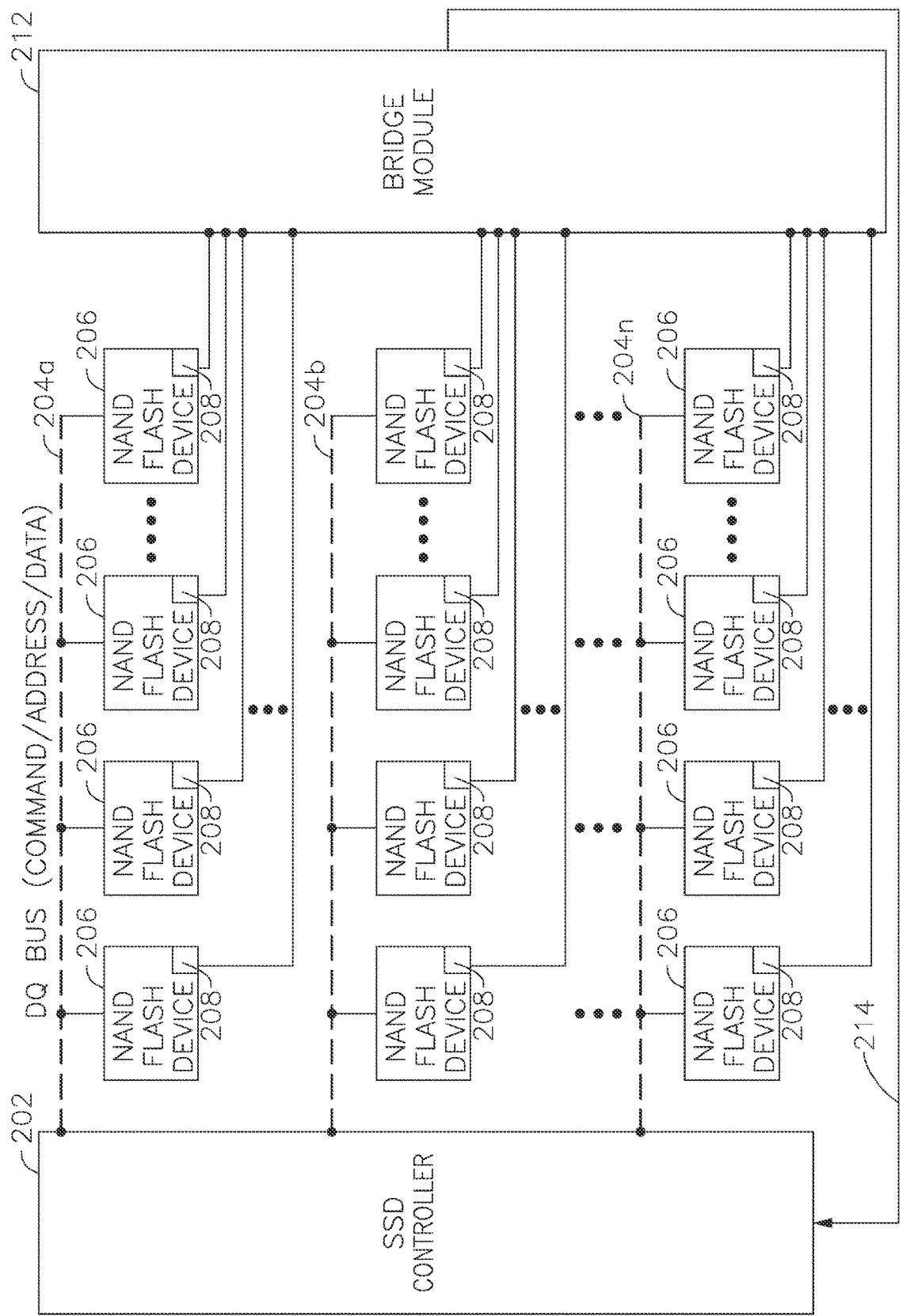
FIG. 2C illustrates a block diagram architecture of the SSD storage device of FIG. 2A with a ready/busy signal with a bridge module, according to some embodiments of the present disclosure.

FIG. 2C illustrates a block diagram architecture of the SSD storage device 200 with a ready/busy signal with a bridge module, according to some embodiments of the present disclosure.

In some embodiments, as in an SSD (e.g., SSD 200), numerous NAND flash devices (e.g., NAND flash devices 206) are connected to a SSD controller (e.g., the SSD controller 202), a bridge module (or a bridge device) 212 that aggregates ready/busy signals (e.g., output from the ready/busy pins 208) from the NAND flash devices (e.g., NAND flash devices 206) to transport to the SSD controller, may be placed between the SSD controller (e.g., the SSD controller 202) and the NAND flash devices (e.g., the NAND flash devices 206) as shown in FIG. 2C. For example, the bridge module 212 is communicatively coupled between SSD controller 202 and NAND flash devices 206. By placing the bridge module 212 that aggregates the ready/busy signals 208 (e.g., output from the ready/busy pins 208) from the NAND flash devices 206 of the SSD 200, between the SSD controller 202 and the NAND flash devices 206, as shown in FIG. 2C, the SSD controller 202 may have a single interface or channel 214 that represents all the NAND flash devices 206, coming from the bridge module 212. The bridge module 212 is communicatively coupled to the SSD controller 202 via the single interface or channel 214 to communicate the device ID and status information of each of the NAND flash devices 206 aggregated at the bridge module 212 to the SSD controller 202.

In the example embodiment of FIG. 2C, the ready/busy pin 208 of each of the NAND flash devices 206 may be directly or individually connected to the bridge module 212. The bridge module 212 may detect the ready/busy signals of each of the NAND flash devices 206 and may report to the SSD controller 202 in a dedicated protocol to let the SSD controller 202 know the die index and its status (e.g., the device ID and status of each of the NAND flash devices 206), when it is updated. In this case, the design protocol may be any of the design protocols that may be implemented in low cost, for example, I²C.

Unlike the example embodiments of FIGS. 2A-2B, the example embodiment of FIG. 2C may not require any ready/busy reporting logic update at the NAND flash device 206 (e.g., ready/busy reporting logic update from the NAND flash device 206 to the SSD controller 202).

Figure 2D:
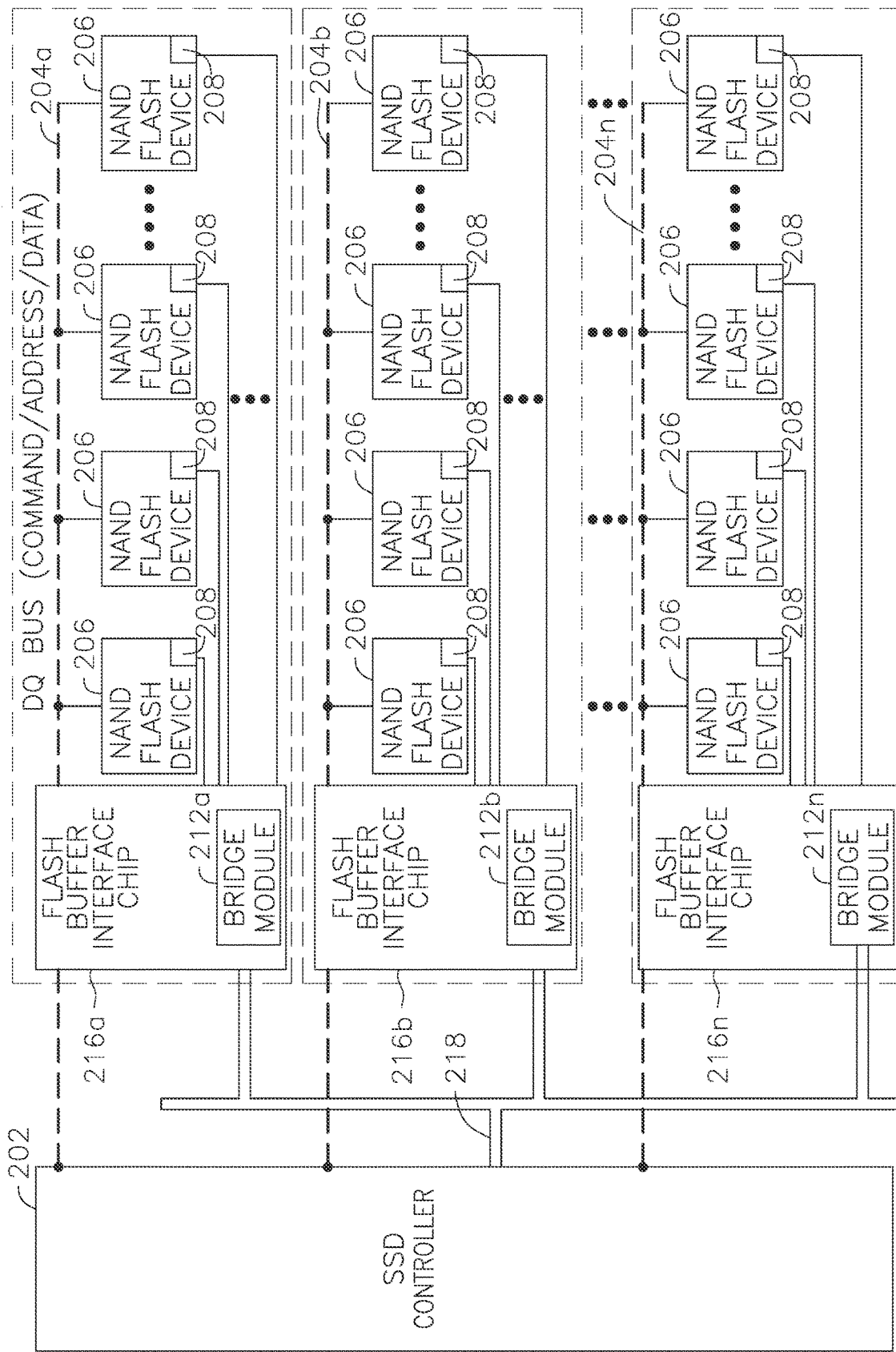
FIG. 2D illustrates a block diagram architecture of the SSD storage device of FIG. 2A with a ready/busy signal with a multi-layer bridge module, according to some embodiments of the present disclosure.

FIG. 2D illustrates a block diagram architecture of the SSD storage device 200 with a ready/busy signal with a multi-layer bridge module, according to some embodiments of the present disclosure.

In some embodiments, as shown in FIG. 2D, the bridge module 212 as shown in FIG. 2C, may be made in multiple layers by utilizing flash buffer chips. To fit in limited size of a SSD form factor, in some embodiments, the NAND flash devices 206 may be made into single physical chip in multi-chip packaging (MCP) technology and to ensure the signal integrity (SI) issue on the system board design, flash buffer chip may be added on interface stage of the SSD.

For example, in the example embodiment of FIG. 2D, the SSD 200 may include a plurality of bridge modules 212a-212n, where each of the plurality of bridge modules 212a-212n may be integrated into a flash buffer interface chip from among a plurality of flash buffer interface chips 216a-216n. The ready/busy signal pins 208 of each of the two or more NAND flash devices 206 arranged in a row may be connected to a bridge module from among the plurality of bridge modules 212a-212n. However, as the number of NAND flash devices 206 grows, the input pin number (e.g., the number of input pins in each of the bridge modules 212a-212n) grows, which may increase the cost of bridge chip implementation in the SSD 200, which may not be ideal for a SSD 200 that has a large number of NAND flash devices.

To resolve this issue, in the example embodiment of FIG. 2D, each of the plurality of bridge modules 212a-212n is connected to the SSD controller 202 via a shared bus 218 using a wire sharing protocol (e.g., I²C). In FIG. 2D, on each of the plurality of flash buffer interface chips 216a-216n, the bridge module (e.g., of the bridge modules 212a-212n) aggregates the ready/busy signal from each NAND flash device 206 in a group of NAND flash devices 206 (e.g., the group may include NAND flash devices arranged along a row (however, the NAND flash devices may not physically lined up in a row)) and sends NAND flash device ID and associated status information to the SSD controller 202 through the shared bus 218 (e.g., the shared bus 218 may be configured like I²C). Therefore, in the example embodiment of FIG. 2D, the SSD controller 202 may include an extra pin for each bridge module 212a-212n to receive the status input from bridge modules 212a-212n rather than an extra pin for each NAND flash device 206. Further, because, the example embodiment of FIG. 2D utilizes the bridge modules 212a-212n that receive input from the ready/busy signal of the NAND flash devices 206, conventional NAND flash devices may be used without any design update on it.

Also, in the example embodiment of FIG. 2D, the SSD controller 202 may be able to drive the load capacitance of the bridge modules 212a-212n, because the bridge modules 212a-212n are connected to the SSD controller through the shared bus 218.

Figure 2E:
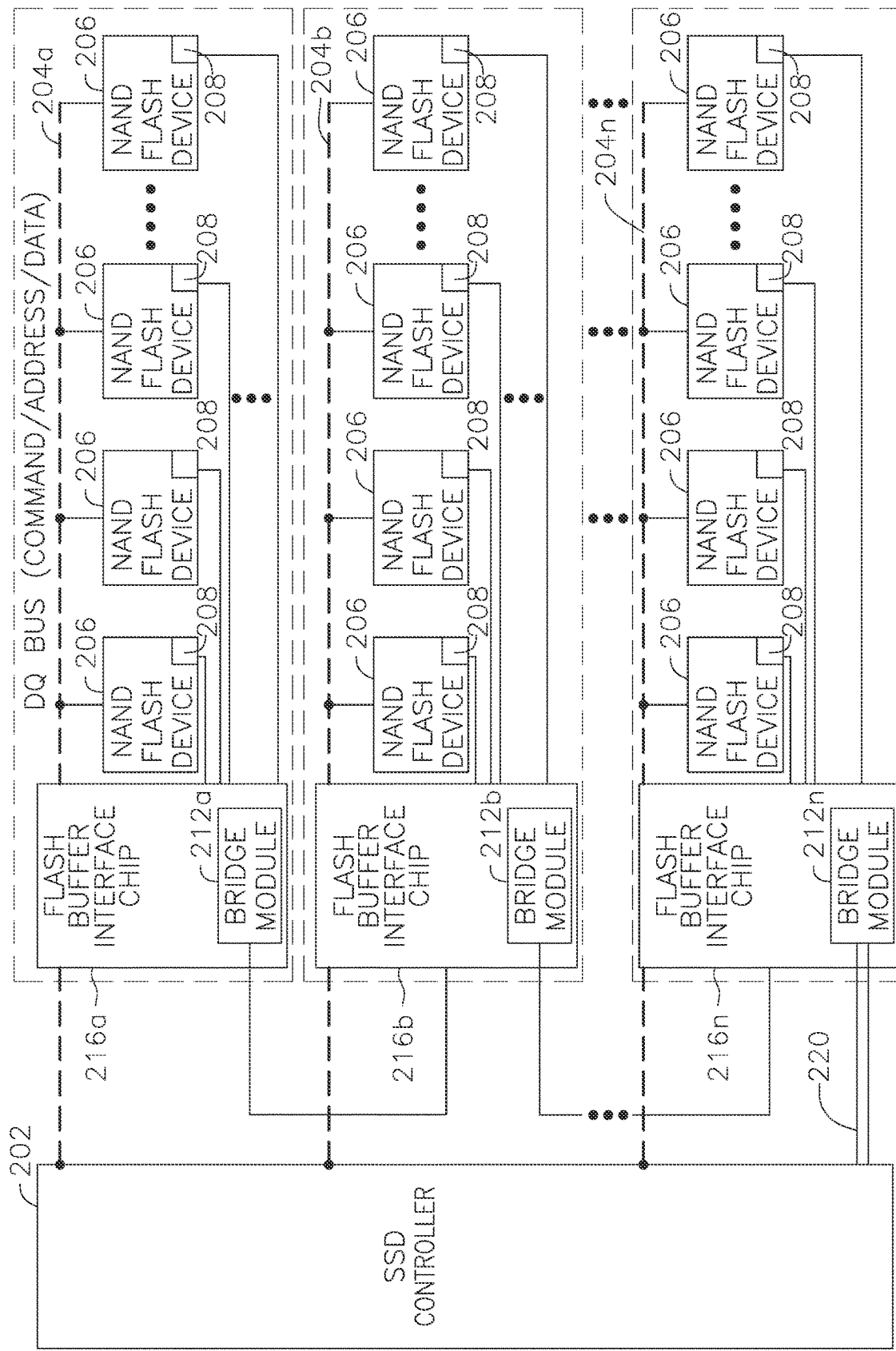
FIG. 2E illustrates a block diagram architecture of the SSD storage device of FIG. 2A, with a ready/busy signal with a multi-layer bridge module, through a daisy-chain connection, according to some embodiments of the present disclosure.

FIG. 2E illustrates a block diagram architecture of the SSD storage device 200 with a ready/busy signal with a multi-layer bridge module, through a daisy-chain connection, according to some embodiments of the present disclosure.

Similar to the example embodiment of FIG. 2D, in the example embodiment of FIG. 2E, the SSD 200 may include a plurality of bridge modules 212a-212n, where each of the plurality of bridge modules 212a-212n may be integrated into a flash buffer interface chip from among a plurality of flash buffer interface chips 216a-216n. The ready/busy signal pins 208 of the two or more NAND flash devices 206 arranged in a row may be connected to a bridge module from among the plurality of bridge modules 212a-212n. However, unlike the example embodiment of FIG. 2D, in the example embodiment of FIG. 2E, the bridge modules 212a-212n may be connected to each other in a daisy chain fashion. In the example embodiment of FIG. 2E, each bridge module from among the bridge modules 212a-212n, sends the ready/busy event to the next module, with associated device ID. Then it is eventually transferred to the SSD controller 202 via a bus 220 connected to the last bridge module of the bridge modules 212a-212n in the daisy chain.

Unlike the example embodiment of FIG. 2D, the example embodiment of FIG. 2E, may not utilize the shared wire (e.g., the shared bus 218) to transfer the die ready/busy status information to the SSD controller 202. Therefore, the SSD controller 202 may not require any special pad implementation to handle high load capacitance. The daisy chain structure of the example embodiment of FIG. 2E may also minimize or reduce pad driving requirement on the SSD controller 202.

In some embodiments, NAND flash devices (e.g., the NAND flash devices 206) may support dual plane operation. Dual plane NAND flash devices (e.g., the NAND flash devices 206) may perform read or program operations concurrently (e.g., simultaneously) on two pages to increase the overall throughput. The memory of the NAND flash devices (e.g., the NAND flash devices 206) may be divided into two planes and each plane may have its own data and cache registers. The two pages that may be read or programmed concurrently (e.g., simultaneously) may belong to different planes.

In some embodiments, the pages that may be concurrently (e.g., simultaneously) read or programmed may have addressing restrictions, for example, when having the same column address. During a dual plane read operation, two pages may be read concurrently (e.g., simultaneously) and may be output substantially continuously saving one read operation. For example, in case of dual plane read operation, the maximum throughput may be achieved when the dual plane cache read is used and the read latency is pipelined.

In some embodiments, the dual plane page program operations may exploit the benefits of the dual plane architecture. As programming time is much longer than the data input time (e.g. 250 us compared to 50 us for a 2 KB page with write cycle time of 25 ns), programming two pages in parallel may be beneficial time wise. For example, in some embodiments, dual plane cache program operation may boost the throughput of data programming and hide the data input time inside the programming phase. In some embodiments, the dual plane program operations may be used to enhance the programming throughput of a 2 KB NAND to the level of a 4 KB page NAND.

FIG. 3 illustrates timing diagrams illustrating plane ID encoding on a single ready/busy signal wire, according to some embodiments of the present disclosure. For example, the example embodiment of FIG. 3 illustrates plane ID encoding in a ready/busy signal from a ready/busy pin of a NAND flash device of a SSD.

In some embodiments, for example, a NAND flash device (e.g., NAND flash device 206 of FIGS. 2A-2E) may be divided into two physical planes. In some embodiments, two-plane commands make better use of the flash arrays on these physical planes by performing PROGRAM, READ, or ERASE operations concurrently (e.g., simultaneously), improving system performance. In some embodiments, when multiple operations are running on a NAND flash device (e.g., NAND flash device 206 of FIGS. 2A-2E), per each plane, ready/busy status reporting may have associated plane index. However, to keep the number of pin pad at the NAND flash device, an encoding scheme as shown in FIG. 3 may be implemented. The encoding scheme of FIG. 3 may be implemented in one or more embodiments from among the embodiments of FIGS. 1A-1B and 2A-2E.

In some embodiments, when a NAND flash device is operating in dual plane mode, for example, when the NAND flash device (e.g., NAND flash device 206 of FIGS. 2A-2E) is performing read or program operations concurrently (e.g., simultaneously) on two pages, ready/busy status from the ready busy pin (e.g., ready busy pin 208 of FIGS. 2A-2E) may have associated plane index or plane ID and may indicate ready/busy status for each plane of the NAND flash device (e.g., NAND flash device 206 of FIGS. 2A-2E).

In some embodiments, the NAND flash device supports (e.g., NAND flash device 206 of FIGS. 2A-2E) plane independent operation (e.g., concurrent or different time operation) processing that runs different operation per plane. However, a single ready/busy wire or the ready/busy output pin (e.g., ready/busy pin 208) of a NAND flash device (e.g., NAND flash device 206 of FIGS. 2A-2E) may not represent the operation status of multiple plane that runs concurrently in the NAND flash device (e.g., a single ready/busy output pin 208 of a NAND flash device 206 may not represent the plane status on plane independent Read/Write). Therefore, the plane identity (ID) which is updated in status of the ready/busy output pin 208 may be encoded into single wire stream.

In the example embodiment of FIG. 3, it may be assumed that, the ready/busy signal (RnB) is AND-gated on each plane operation status, for example, as shown in FIG. 3(a). For example, when both planes of a NAND flash device (e.g., NAND flash device 206 of FIGS. 2A-2E) are busy, the ready/busy status of each plane is set to "LOW (0)". When one of the two planes of the NAND flash device completes processing the current command, the ready/busy state of such plane becomes HIGH (1), however, the ready/busy state of the other plane is still kept at LOW (0), because such plane is still processing a command. In such a case, the status of the single ready/busy pin (e.g., the ready busy pin 208) on the NAND flash device (e.g., the NAND flash device 206), may remain "LOW (0)" because one of the planes in the NAND flash device (e.g., the NAND flash device 206) is still "busy" processing a current command. When both planes of the NAND flash device (e.g., the NAND flash device 206) completes processing the current command, the read/busy state of each plane is set to HIGH (1) and the ready/busy pin (e.g., the ready busy pin 208) on the NAND flash device (e.g., the NAND flash device 206) is set to HIGH (1), as both planes in the NAND flash device (e.g., the NAND flash device 206) are ready to receive and process a new command from a controller (e.g., SSD controller 202). Therefore, the ready/busy pin (e.g., the ready busy pin 208) on the NAND flash device may be HIGH (1), only if both planes of the NAND flash device are ready to receive and process a new command. This characteristic of the ready/busy pin (e.g., the ready busy pin 208) on the NAND flash device can be achieved by "AND-gating" the ready/busy state of each plane, for example, by using the ready/busy state of each plane as an input of an AND gate and the output of the AND gate may be connected to the ready/busy pin (e.g., ready bust pin 208) of the NAND flash device.

In some embodiments, as shown in FIG. 3(b), when a NAND flash device (e.g., NAND flash device 206) is operating in a single plane mode (e.g., "plane 0"), when the plane 0 operation is completed, the RnB signal goes HIGH (or READY) and associated plane index code 302 (e.g., in form of a pulse) follows with preamble bit. The pulse width (e.g., the pulse width of the pulse train indicating the plane index) may be configured at initializing step, like a universal asynchronous receiver/transmitter (UART)/Baud rate fashion.

However, in some embodiments, as shown in FIG. 3(c), when a NAND flash device (e.g., NAND flash device 206) is operating in a dual plane mode (e.g., "plane 0" and "plane 1"), and when plane 0 and/or plane 1 operation is completed, the RnB signal goes HIGH (or READY) and each associated plane index code (e.g., in form of a pulse) follows with preamble bit. For example, when the plane 0 and/or plane 1 operation is completed, the RnB signal goes HIGH (or READY) and a plane index code 302(a) associated with plane 0 or plane 1 may follow with a preamble bit and another plane index code 302(b) associated with the other one of the plane 0 or plane 1 may follow with a preamble bit.

A bridge module (e.g., the bridge module 212 as discussed with respect to FIG. 2C or the bridge modules 212a-212n as discussed with respect to FIGS. 2D-2E) connected between the NAND Flash device (e.g., the NAND flash device 206) and the SSD controller (e.g., the SSD controller 202) of the SSD, may decode the single wire encoded plane index number when the ready/busy signal toggles, and reports to the SSD controller chip (e.g., the SSD controller 202 of FIGS. 2A-2E).

Figure 4:
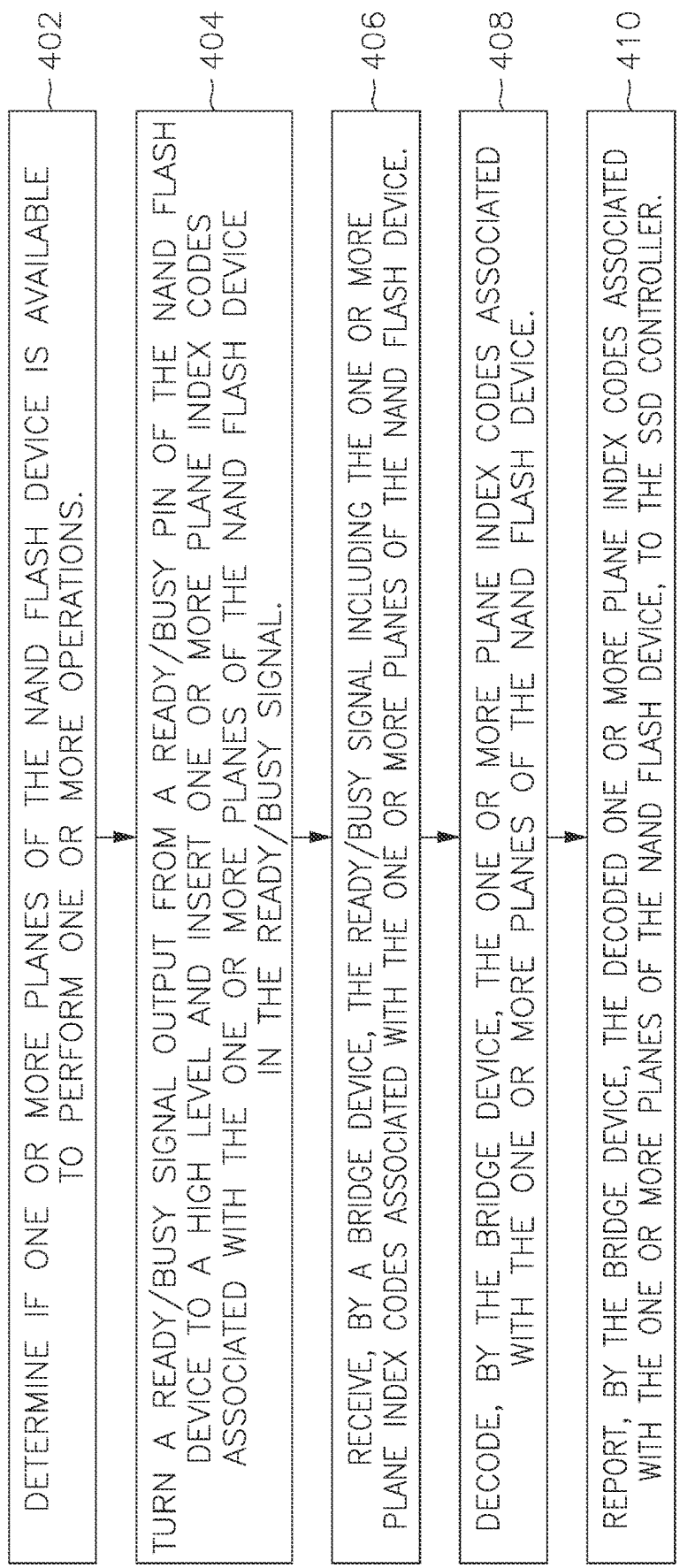
FIG. 4 illustrates a method of encoding one or more plane IDs of one or more planes of a NAND flash device of a SSD, according to the example embodiment of FIG. 3.

FIG. 4 illustrates a method of encoding one or more plane IDs of one or more planes of a NAND flash device of a SSD, according to the example embodiment of FIG. 3. The method of FIG. 4 may be implemented in the embodiments of FIGS. 2C-2E.

As illustrated in FIG. 4, at 402, it may be determined if one or more planes (e.g., "plane 0" and "plane 1") of the NAND flash device (e.g., the NAND flash device 206 of FIGS. 2A-2E) is available to perform one or more operations (e.g., PROGRAM, READ, or ERASE operations concurrently).

At 404, based on determining that the one or more planes (e.g., "plane 0" and "plane 1") of the NAND flash device (e.g., the NAND flash device 206 of FIGS. 2A-2E) is available to perform one or more operations (e.g., PROGRAM, READ, or ERASE operations concurrently), a ready/busy signal output from a ready busy pin (e.g., ready/busy pin 208 of FIGS. 2A-2E) of the NAND flash device (e.g., the NAND flash device 206 of FIGS. 2A-2E) is turned to a high level (e.g., HIGH or READY) and one or more plane index codes (e.g., plane index codes 302(a), 302(b) of FIG. 3) associated with the one or more planes (e.g., "plane 0" and "plane 1") of the NAND flash device in the ready busy signal are inserted, where each of the plane index code is represented in form of a pulse and each of the plane index code follow a preamble bit.

At 406, a bridge device (e.g., the bridge module 212 as discussed with respect to FIG. 2C or the bridge modules 212a-212n as discussed with respect to FIGS. 2D-2E), which is communicatively coupled between the ready busy pin of the NAND flash device and a SSD controller of the SSD (e.g., the SSD controller 202 of SSD 200 of FIGS. 2A-2E), receives the ready/busy signal including the one or more plane index codes associated with the one or more planes of the NAND flash device, from the NAND flash device.

At 408, the bridge device decodes the one or more plane index codes associated with the one or more planes of the NAND flash device.

At 410, the bridge device reports the decoded one or more plane index codes associated with the one or more planes of the NAND flash device, to the SSD controller.

Although example embodiments of a layered NAND status reporting structure have been specifically described and illustrated herein, many modifications and variations will be apparent to those skilled in the art. For example, the layered reporting structure described herein may be implemented in storage systems that include other types of storage devices (e.g., NOR flash devices, hard disk drives, etc.). Accordingly, it is to be understood that a layered status reporting structure according to principles of this disclosure may be embodied other than as specifically described herein. The present disclosure is also defined in the following claims, and equivalents thereof.

What is claimed is:

1. A storage system comprising:
    a controller;
    a first storage device comprising a first ready/busy pin configured to output a first ready/busy signal carrying a first device identity (ID) and status information associated with the first storage device;
    a second storage device comprising a second ready/busy pin configured to output a second ready/busy signal carrying a second device ID and status information associated with the second storage device;
    a first shared data bus communicatively coupled between the controller, the first storage device, and the second storage device;
    a first shared ready/busy signal channel directly communicatively coupled to the first ready/busy pin of the first storage device, the second ready/busy pin of the second storage device, and the controller according to a wire-sharing protocol, wherein the first storage device is configured to send the first device ID and status information associated with the first storage device to the controller via the first shared ready/busy signal channel and the second storage device is configured to send the second device ID and status information associated with the second storage device to the controller via the first shared ready/busy signal channel;
    a third storage device;
    a fourth storage device; and
    a second shared ready/busy signal channel directly communicatively coupled to a third ready/busy pin of the third storage device, a fourth ready/busy pin of the fourth storage device, and the controller according to the wire-sharing protocol, the second shared ready/busy signal channel being configured to aggregate a third ready/busy signal from the third ready/busy pin of the third storage device and a fourth ready/busy signal from the fourth ready/busy pin of the fourth storage device to transport to the controller,
    wherein the first shared ready/busy signal channel is configured to communicate with the controller independently from the second shared ready/busy signal channel, and
    wherein the second shared ready/busy signal channel is configured to communicate with the controller independently from the first shared ready/busy signal channel.

2. The storage system of claim 1, wherein the storage system is a solid state drive (SSD), the first storage device and the second storage device are NAND flash devices, and the wire-sharing protocol is an inter-integrated circuit I²C) communication protocol.

3. The storage system of claim 1, wherein the first storage device is configured to send the first device ID and status information to the controller via the first shared ready/busy signal channel in response to the first storage device being updated internally, or in response to a command received from the controller.

4. The storage system of claim 1, wherein:
    the third storage device comprises the third ready/busy pin and is configured to output the third ready/busy signal carrying a third device ID and status information associated with the third storage device;
    the fourth storage device comprises the fourth ready/busy pin and is configured to output the fourth ready/busy signal carrying a fourth device ID and status information associated with the fourth storage device, wherein the storage system further comprises:

a second data bus communicatively coupled between the controller, the third storage device, and the fourth storage device, wherein the third storage device is configured to send the third device ID and status information associated with the third storage device to the controller via the second shared ready/busy signal channel and the fourth storage device is configured to send the fourth device ID and status information associated with the fourth storage device to the controller via the second shared ready/busy signal channel.

5. The storage system of claim 4, wherein the third storage device is configured to send the third device ID and status information to the controller via the second shared ready/busy signal channel in response to the third storage device being updated internally, or in response to a command received from the controller.

6. The storage system of claim 1, wherein the first storage device and the second storage device are configured to act as controlling devices, and the controller is configured to act as a controlled device that receives device IDs and status information of the controlling devices.

7. The storage system of claim 1, wherein the controller is configured to act as a controlling device and the first storage device and the second storage device are configured to act as controlled devices.

8. The storage system of claim 1, wherein the first storage device is configured to, in response to receiving a command comprising the first device ID of the first storage device from the controller, perform a read operation or a write operation using the first shared data bus in communication with the controller.

9. A storage system comprising:
a controller;
a first storage device comprising a first ready/busy pin configured to output a first ready/busy signal carrying a first device identity (ID) and status information associated with the first storage device;
a second storage device comprising a second ready/busy pin configured to output a second ready/busy signal carrying a second device ID and status information associated with the second storage device;
a first shared data bus communicatively coupled between a first bridge device, the first storage device, and the second storage device;
the first bridge device communicatively coupled between the controller, and the first ready/busy pin of the first storage device and the second ready/busy pin of the second storage device, the first bridge device being configured to aggregate the first ready/busy signal from the first ready/busy pin of the first storage device and the second ready/busy signal from the second ready/busy pin of the second storage device to transport to the controller;
a third storage device;
a fourth storage device; and
a second bridge device communicatively coupled between the controller, and a third ready/busy pin of the third storage device and a fourth ready/busy pin of the fourth storage device, the second bridge device being configured to aggregate a third ready/busy signal from the third ready/busy pin of the third storage device and a fourth ready/busy signal from the fourth ready/busy pin of the fourth storage device to transport to the controller, wherein the first bridge device and the second bridge device are configured to communicate with the controller independently from each other, and wherein the first bridge device and the second bridge device are connected to the controller via a shared bus using a wire sharing protocol.

10. The storage system of claim 9, wherein the storage system is a solid state drive (SSD) and the first storage device and the second storage device are NAND flash devices.

11. The storage system of claim 9, wherein the first shared data bus is shared among the first storage device and the second storage device using an inter-integrated circuit ($I^2C$) communication protocol.

12. The storage system of claim 9, wherein the first ready/busy pin of the first storage device and the second ready/busy pin of the second storage device are directly connected to the first bridge device.

13. The storage system of claim 9, wherein the first bridge device is further configured to detect the first ready/busy signal of the first storage device and the second ready/busy signal of the second storage device and report to the controller to communicate the first device ID and status information of the first storage device and the second device ID and status information of the second storage device.

14. The storage system of claim 13, wherein the first bridge device is communicatively coupled to the controller via a channel and the shared bus to communicate the first device ID and status information of the first storage device and the second device ID and status information of the second storage device aggregated at the first bridge device to the controller.

15. The storage system of claim 9, wherein:
the third storage device comprises the third ready/busy pin and is configured to output the third ready/busy signal carrying a third device ID and status information associated with the third storage device, and the fourth storage device comprises the fourth ready/busy pin and is configured to output the fourth ready/busy signal carrying a fourth device ID and status information associated with the fourth storage device, wherein the storage system further comprises:
a second data bus communicatively coupled between the controller, the third storage device, and the fourth storage device.

16. The storage system of claim 15, wherein the first bridge device is integrated into a first flash buffer interface chip and the second bridge device is integrated into a second flash buffer interface chip.

17. The storage system of claim 15, wherein the first bridge device is configured to send, the first device ID and status information of the first storage device and the second device ID and status information of the second storage device aggregated from the first ready/busy signal and the second ready/busy signal, to the second bridge device.

18. The storage system of claim 17, wherein the second bridge device is configured to aggregate the first ready/busy signal and the second ready/busy signal from the first bridge device and send the first ready/busy signal, the second ready/busy signal, the third ready/busy signal, and the fourth ready/busy signal to the controller via the shared bus.

19. A method of encoding one or more plane identities (IDs) of one or more planes of a storage device, wherein memory of the storage device is divided into at least two planes, each of the at least two planes comprising a data register and a cache register, the method comprising:

determining, by the storage device, if the one or more planes of the at least two planes of the storage device is available to perform one or more operations;

based on determining that the one or more planes of the storage device is available to perform the one or more operations, turning, by the storage device, a ready/busy signal output from a ready/busy pin of the storage device to a first level and inserting one or more plane index codes associated with the one or more planes of the storage device in the ready/busy signal, wherein each of the plane index code is represented in form of a pulse and each of the plane index code follow a preamble bit;

receiving, by a bridge device communicatively coupled between the ready/busy pin of the storage device and a controller, the ready/busy signal comprising the one or more plane index codes associated with the one or more planes of the storage device, from the storage device;

decoding, by the bridge device, the one or more plane index codes associated with the one or more planes of the storage device; and reporting, by the bridge device, the decoded one or more plane index codes associated with the one or more planes of the storage device, to the controller, wherein the controller is configured to transmit/receive data to/from the storage device via the bridge device and a first shared data bus communicatively coupled between the bridge device and the storage device, wherein the storage device is configured to perform read or program operations concurrently on at least two pages, wherein each of the at least two planes of the storage device is configured to perform the read or the program operations to corresponding one of the at least two pages concurrently and independent of each other using the corresponding data register and the cache register, and wherein the ready/busy signal output from the ready/busy pin of the storage device is turned to the first level based on the at least two planes of the storage device being available to perform the read or the program operations on the data.

* * * * *